US008076648B2

(12) United States Patent
Shong et al.

(10) Patent No.: US 8,076,648 B2
(45) Date of Patent: Dec. 13, 2011

(54) PARTIAL DISCHARGE MEASURING APPARATUS USING UV SENSOR ARRAY AND METHOD THEREOF

(75) Inventors: Kil Mok Shong, Kangwon-Do (KR); Young Seok Kim, Gyeonggi-Do (KR)

(73) Assignee: Korea Electric Safety Corp., Seoul (KR)

( * ) Notice: Subject to any disclaimer, the term of this patent is extended or adjusted under 35 U.S.C. 154(b) by 317 days.

(21) Appl. No.: 12/472,923

(22) Filed: May 27, 2009

(65) Prior Publication Data
US 2010/0163743 A1 Jul. 1, 2010

(30) Foreign Application Priority Data

Dec. 30, 2008 (KR) .......................... 10-2008-0136501

(51) Int. Cl.
*G01J 1/42* (2006.01)
(52) U.S. Cl. ....................................................... 250/372
(58) Field of Classification Search ................... 250/372
See application file for complete search history.

(56) References Cited

U.S. PATENT DOCUMENTS
6,700,496 B2 * 3/2004 Francke et al. ............... 340/578

OTHER PUBLICATIONS

Moore et al., Remote Sensing of Voltage Using Optical Assessment of Corona, 2000, IEEE, pp. 1159-1164.*
Zang et al., Research on Mechanism and Ultraviolet Imaging of Corona Discharge of Electric Device Faults, Jul. 18, 2008, IEEE, pp. 690-693.*

* cited by examiner

*Primary Examiner* — David Porta
*Assistant Examiner* — Christine Sung
(74) *Attorney, Agent, or Firm* — Harness, Dickey & Pierce, P.L.C.

(57) ABSTRACT

Disclosed herein is a method and apparatus for measuring partial discharge using a UV sensor array. The apparatus includes a UV sensor array including plural sensors detecting UV rays from an analyzing target of a power facility at a location separated a predetermined distance from the target and converting the UV rays into discharge current, an image measurement unit measuring the distance between the sensor array and the target and supplying an actual image of the target, a UV intensity detection unit measuring intensity of the discharge current converted from the UV rays detected by the sensor array, and a UV location detection unit analyzing and outputting a UV emitting location obtained by matching the discharge current intensity measured by the UV intensity detection unit to combined data of the actual image of the target supplied from the image measurement unit and sensor locations of the sensor array.

4 Claims, 9 Drawing Sheets

PARTIAL DISCHARGE MEASURING APPARATUS USING UV SENSOR ARRAY AND METHOD THEREOF

BACKGROUND OF THE INVENTION

1. Field of the Invention

The present invention relates to a method and apparatus for measuring partial discharge using a UV sensor array, and more particularly to an apparatus for effectively analyzing UV detection location, UV intensity, and discharge quantity in air discharge caused by insulation deterioration of power facilities.

2. Description of the Related Art

Power facilities refer to an aggregate of instruments for use in controlling transfer, storage, transformation, and shielding of electric energy. The power facilities generally undergo insulation failure under negative conditions, such as long-term use at high voltage, manufacturing defect, installation defect, and the like.

Particularly, current flow on surfaces or discharge in air can lead to various disasters such as electric power interruption, fire, damage to power facilities, and the like under negligence of security management.

In general, when a defect is formed on a certain component used in large size electric power facilities including power cables and other components, partial discharge occurs from this defect and continuation of the partial discharge results in discharge by insulation deterioration on the surfaces of the power facilities or in air, which leads to insulation failure of the power cables and other components.

Although there are various direct factors causing insulation deterioration of insulators, such as temperature, humidity, mechanical vibration, and other conditions around the insulators, the most representative direct factor of insulation deterioration is internal partial discharge.

Phenomena caused by the partial discharge include light emission, noise, electric energy emission, gas discharge, and the like.

If discharge by insulation deterioration on the surfaces of the power facilities or discharge in air can be measured at an initial time, the power cables and other components of the power facilities can be prevented from undergoing insulation failure.

A conventional apparatus for detecting insulation deterioration caused by partial discharge is a measurement system that includes a sensor and a main system for receiving and analyzing signals.

Among such conventional systems, a system for detecting insulation deterioration using an ultrasound sensor can detect insulation deterioration only after the deterioration proceeds to some degree, and thus cannot detect an initial state of insulation deterioration, thereby providing a high frequency of erroneous detection.

Therefore, recently, a discharge detection system is used to detect an image of UV rays with a camera, which is provided with a UV sensor for detecting discharge UV rays caused by insulation deterioration.

However, such a conventional discharge detection system only detects UV rays, and cannot provide analysis results relating to UV detection location or UV intensity.

SUMMARY OF THE INVENTION

The present invention is conceived to solve the problems as described above, and an aspect of the present invention is to provide a method and apparatus for measuring partial discharge using a UV sensor array, which can analyze and output emitting locations and intensity of UV rays through effective detection of far-ultraviolet regions when partial discharge occurs on an exposed filling part of power facilities.

In accordance with an aspect of the present invention, an apparatus for measuring partial discharge using a UV sensor array includes: a UV sensor array including a plurality of sensors detecting UV rays from an analyzing target of a power facility at a location separated a predetermined distance from the target and converting the UV rays into discharge current; an image measurement unit measuring the distance between the sensor array and the target and supplying an actual image of the target; a UV intensity detection unit measuring intensity of the discharge current converted from the UV rays detected by the sensor array; and a UV location detection unit analyzing and outputting a UV emitting location obtained by matching the discharge current intensity measured by the UV intensity detection unit to combined data of the actual image of the target supplied from the image measurement unit and sensor locations of the sensor array.

Each of the sensors may include cathode and anode electrodes which detect and convert the UV rays into the discharge current, a guide mirror which guides the UV rays to the electrodes, and an amplifier which amplifies the discharge current.

The apparatus may further include an analysis data output unit outputting analysis data obtained by combining data of the discharge current intensity measured by the UV intensity detection unit and data of the UV emitting location output from the UV location detection unit.

In accordance with another aspect of the present invention, a method of measuring partial discharge using a UV sensor array includes detecting UV rays emitted from an analyzing target of a power facility with a sensor array at a location separated a predetermined distance from the target, the sensor array including a plurality of sensors; measuring the distance between the sensor array and the target and supplying an actual image of the target by an image measurement unit; measuring intensity of discharge current by a IV intensity detection unit, the discharge current being obtained by converting the UV rays detected by the sensor array; and outputting a UV emitting location on the target by matching data of the discharge current intensity measured by the UV intensity detection unit to combined data of the actual image of the target supplied from the image measurement unit and sensor locations of the sensor array.

BRIEF DESCRIPTION OF THE DRAWINGS

The above and other aspects, features and advantages of the present invention will become apparent from the following description of exemplary embodiments given in conjunction with the accompanying drawings, in which.

DETAILED DESCRIPTION OF THE EMBODIMENT

Hereinafter, embodiments of the present invention will be described in detail with reference to the accompanying drawings.

Figure 1:
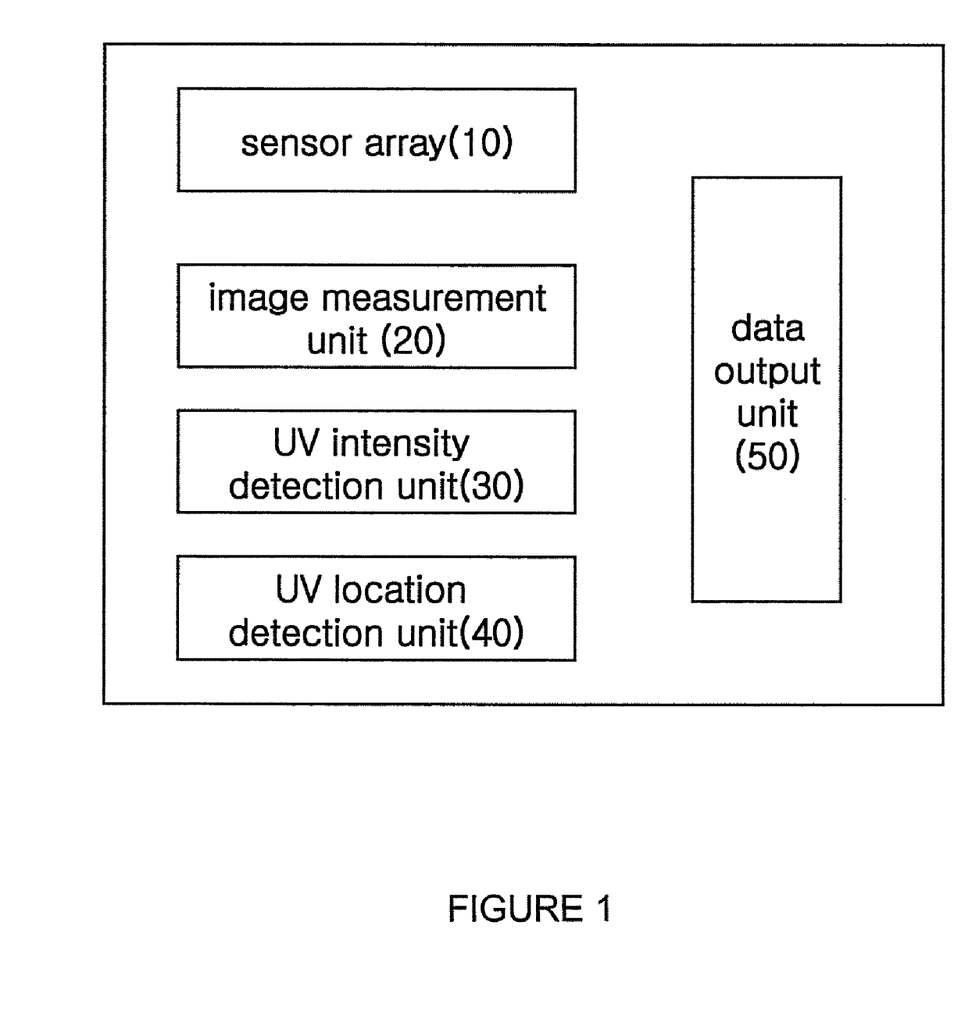
FIG. 1 is a block diagram of an apparatus for measuring partial discharge using a UV sensor array according to an embodiment of the present invention.

Referring to FIG. 1, which is a block diagram of an apparatus for measuring partial discharge using a UV sensor array according to an embodiment of the present invention, the apparatus includes a UV sensor array 10 which is positioned at a location separated a predetermined distance from an analyzing target of a power facility, such as an insulator, and includes a plurality of sensors for detecting UV rays emitted from the target; an image measurement unit 20 which measures the distance between the sensor array and the target and supplies an actual image of the target; a UV intensity detection unit 30 which measures intensity of discharge current converted from the UV rays detected by the sensor array; and a UV location detection unit 40 which analyzes and outputs a UV emitting location obtained by matching the discharge current intensity measured by the UV intensity detection unit 30 to combined data of the actual image of the target supplied from the image measurement unit 20 and sensor locations of the sensor array 10.

In FIG. 1, the UV sensor array 10 may be provided as a detection kit which includes plural sensors combined in a predetermined arrangement on a plane.

In the UV sensor array 10 such as the detection kit, each of the sensors 11 has a predetermined detection region.

Figure 2A:
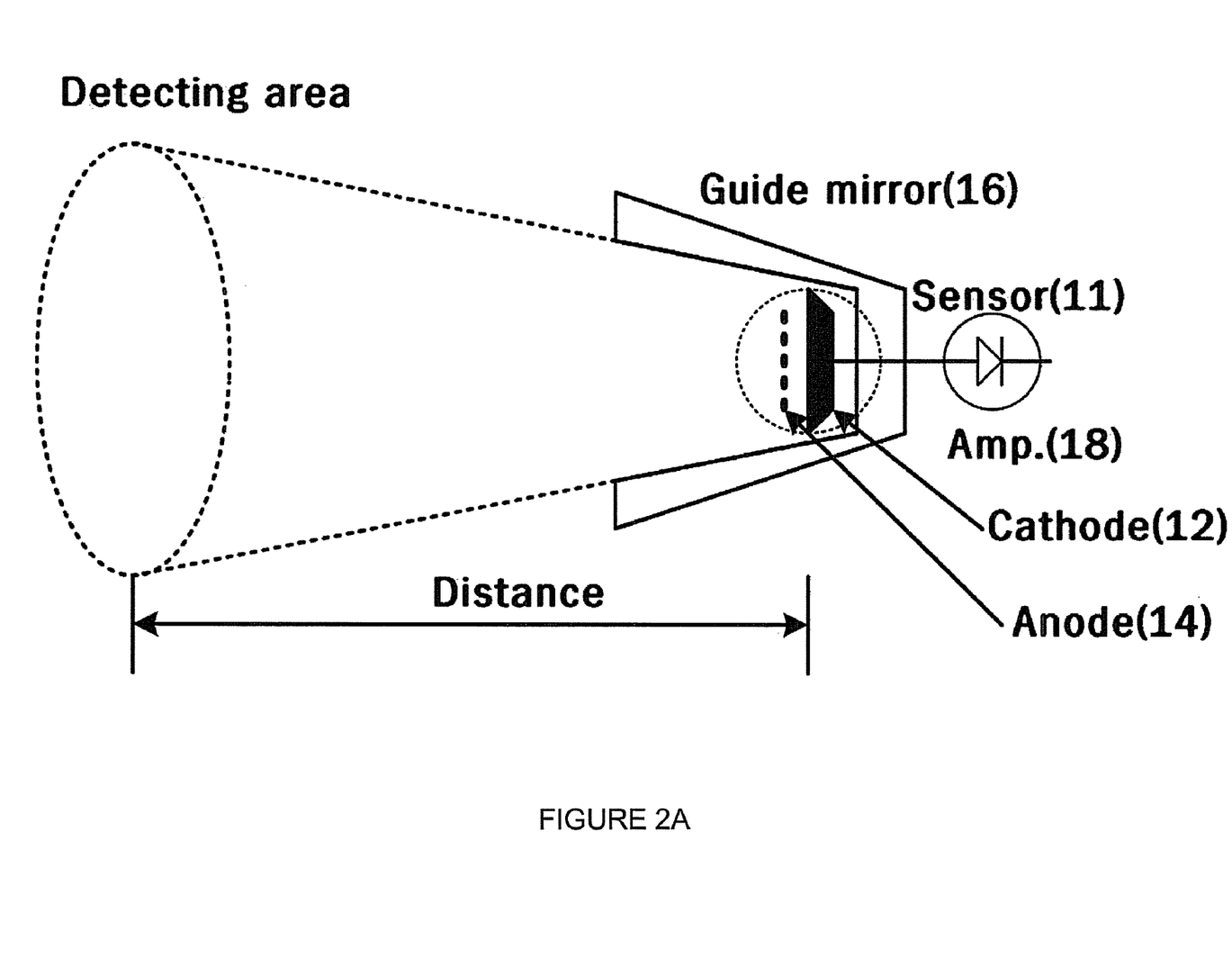
FIG. 2a is a schematic diagram of a sensor constituting a sensor array according to an embodiment of the present invention.

FIG. 2a is a schematic diagram of a sensor constituting the sensor array according to an embodiment of the present invention.

As shown in FIG. 2a, the UV sensor 11 includes cathode and anode electrodes 12 and 14 which detect and convert UV rays into discharge current, a guide mirror 16 which guides the UV rays to the electrodes 12 and 14, and an amplifier 18 which amplifies the converted discharge current.

In FIG. 2a, the sensor may have detection sensitivity for detecting ultraviolet light in the range of 185~260 nm.

Figure 2B:
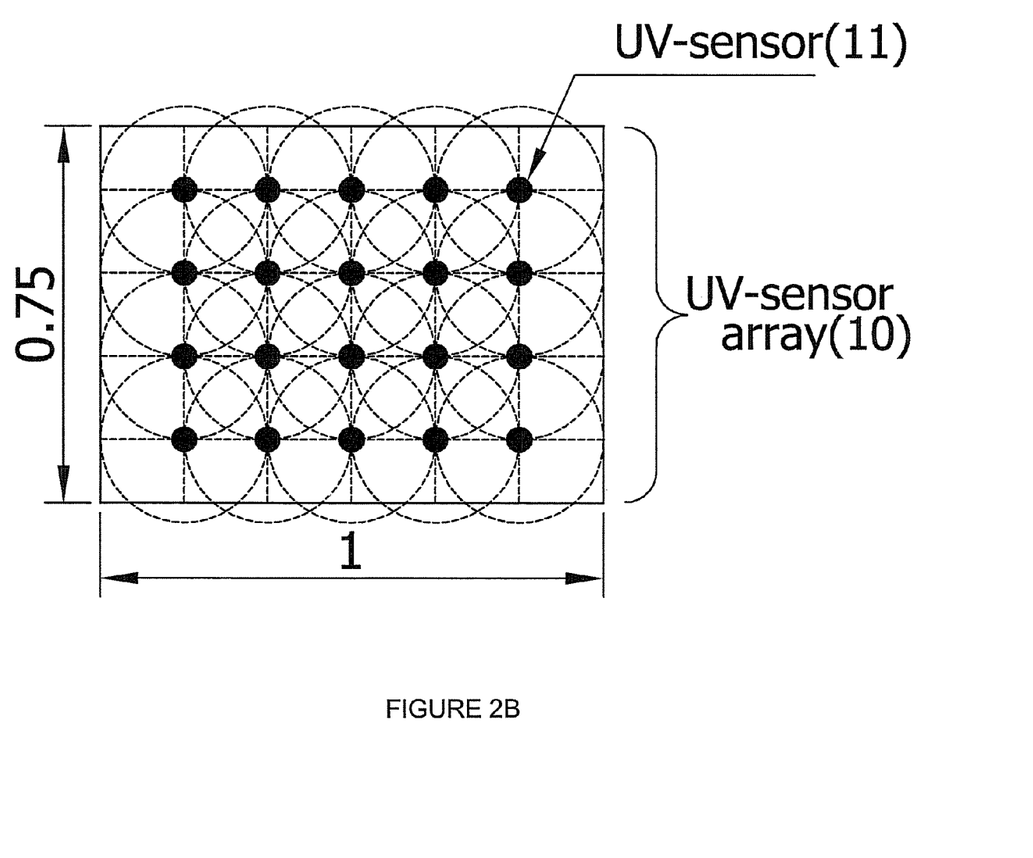
FIG. 2b is a view illustrating a detection region of sensors constituting the sensor array.
Figure 2C:
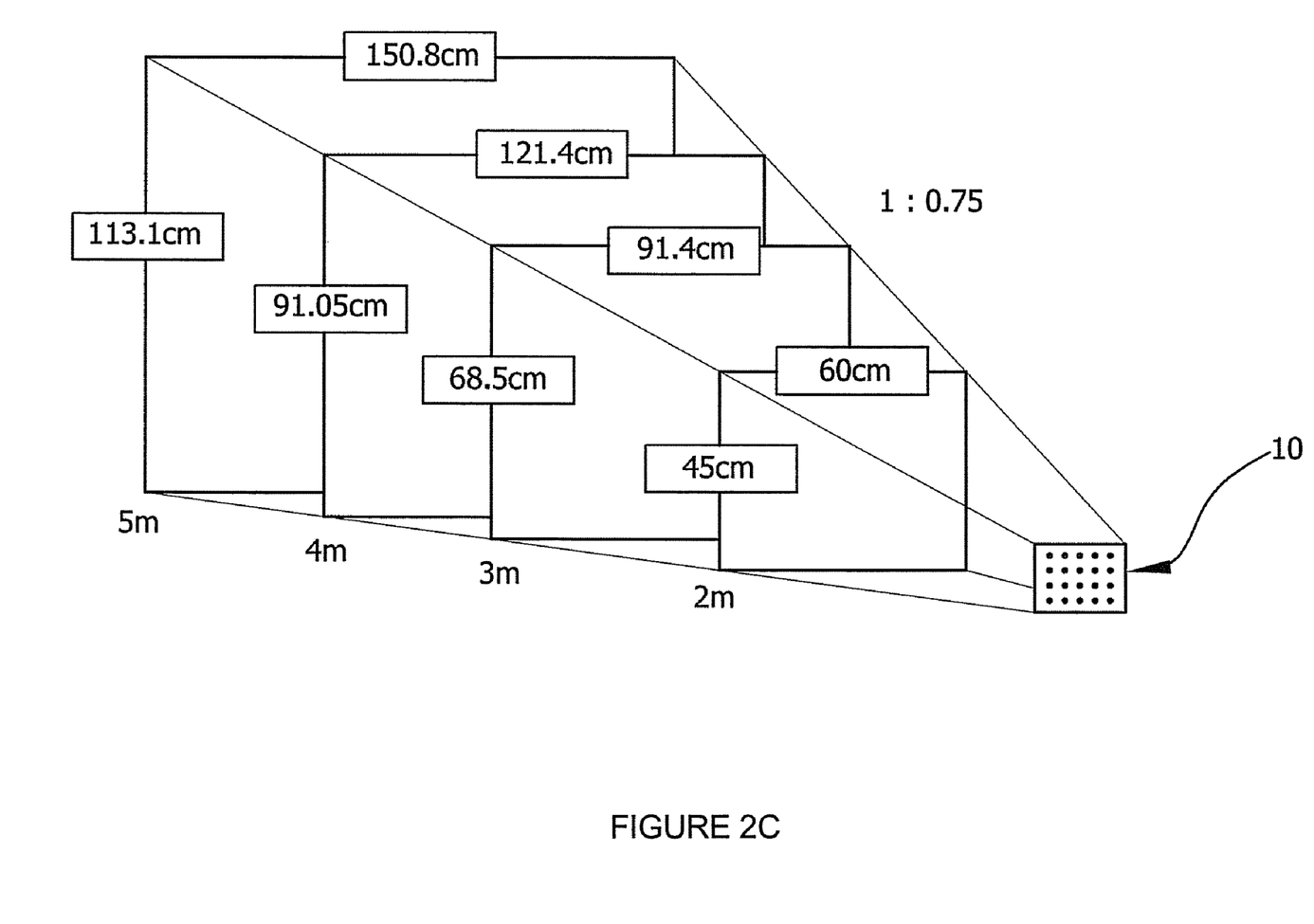
FIG. 2c is a view illustrating an area of the detection region of the sensor array according to a measuring distance.
Figure 2D:
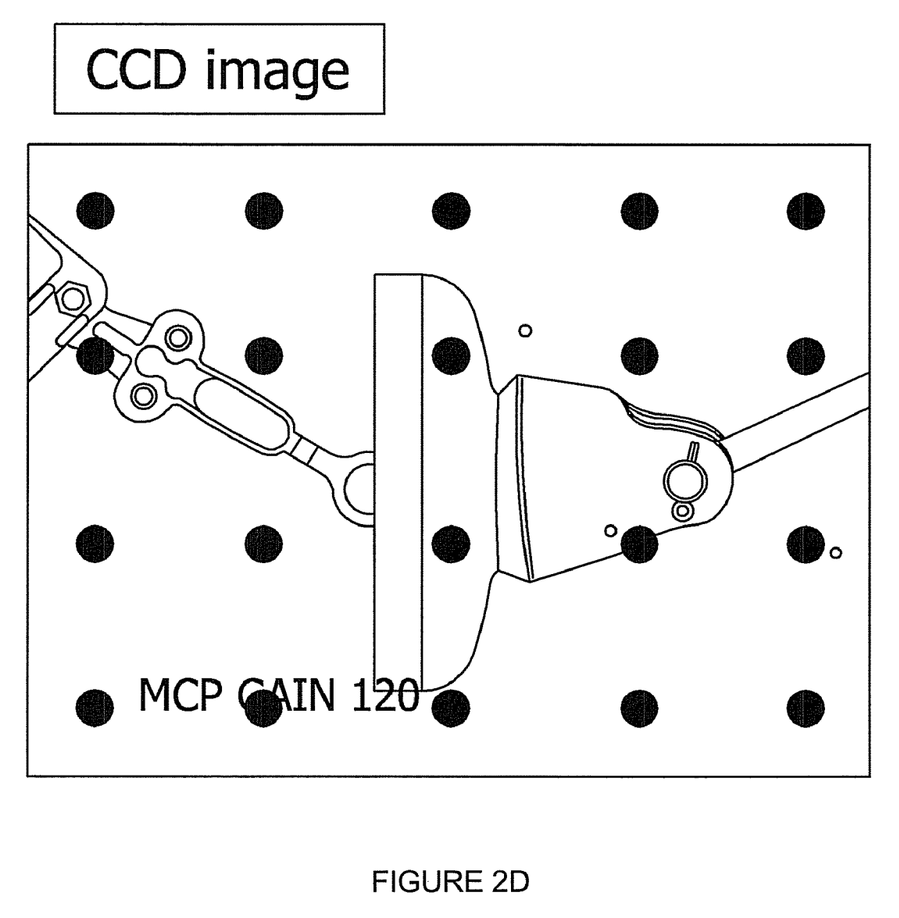
FIG. 2d is a CCD image of sensor locations in the sensor array.

FIG. 2b is a view illustrating a detection region of the sensors constituting the sensor array, FIG. 2c is a view illustrating an area of the detection region of the sensor array according to a measuring distance, and FIG. 2d is a CCD image of sensor locations in the sensor array.

As shown in FIG. 2b, each of the sensors arranged in the sensor array 10 detects UV rays within a predetermined detection range on a screen or in the detection region.

The detection range or area of each sensor 11 will become an important factor in determining precision and an analyzing range of the apparatus.

FIG. 2c illustrates detection areas depending on a distance of 2~5 m by the sensor array that has a width to length ratio of 1:0.75 and includes 20 sensors.

In FIG. 1, the image measurement unit 20 measures the distance between the UV sensor array 10 and the target, and supplies an actual image of the target.

As shown in FIG. 2d, sensor locations of the sensor array are combined with the actual image of the target of the power facility, which emits UV rays.

In FIG. 1, the UV intensity detection unit 30 measures intensity of discharge current obtained by amplifying and converting the UV rays, which have been detected by the sensors of the UV sensor array 10.

Figure 3:
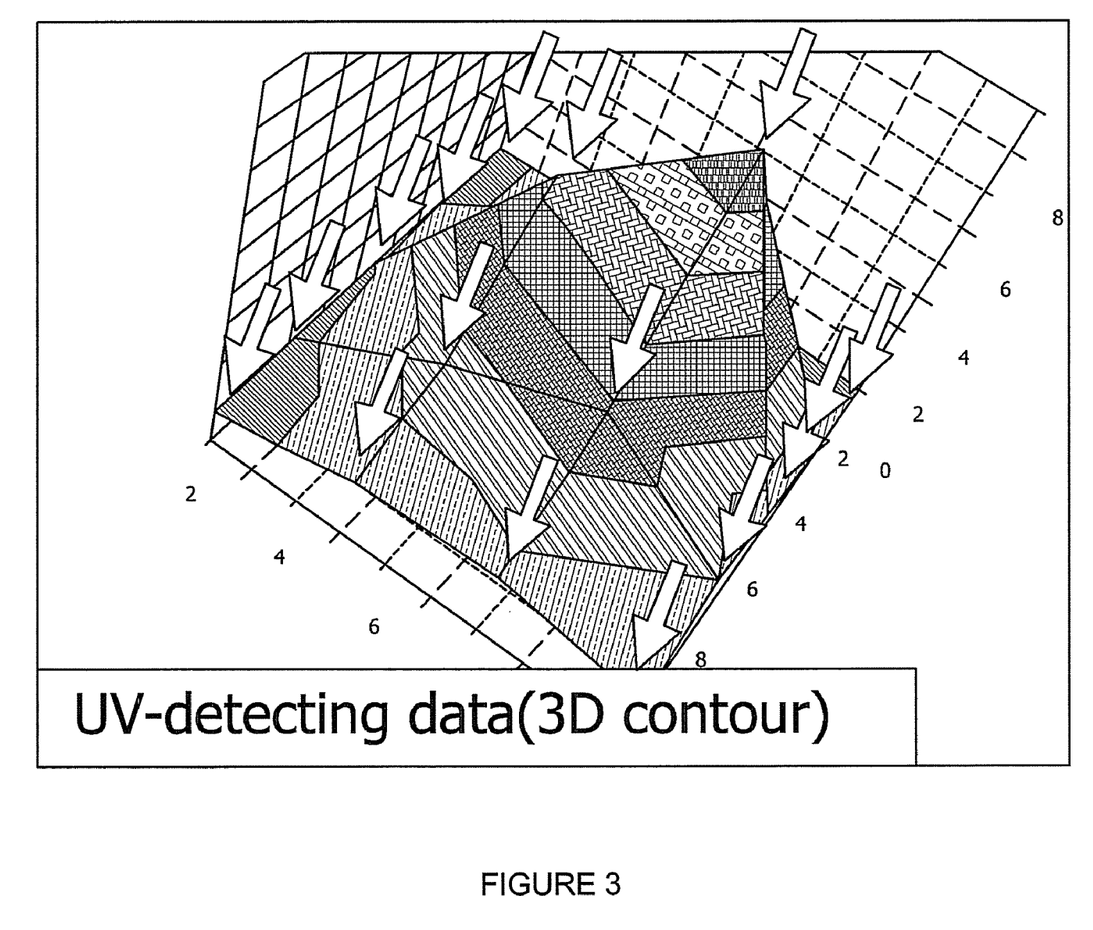
FIG. 3 is an image of UV discharge current data mapped in a three-dimensional contour, in which the UV discharge current is detected by a UV intensity detection unit.

FIG. 3 is an image of UV discharge current data mapped in a three-dimensional contour, in which the UV discharge current is detected by the UV intensity detection unit 30.

In FIG. 3, arrows indicate the respective sensors constituting the sensor array 10.

As shown in FIG. 3, a particular arrow indicates the highest detection value, which is obtained by a sensor corresponding to the particular arrow.

In FIG. 1, the UV location detection unit 40 analyzes locations of the sensors of the sensor array 10 which detect the discharge current, and outputs a UV emitting location based on combined data of the actual image of the target and the sensor locations in the sensor array 10, as shown in FIG. 2d.

Figure 4A:
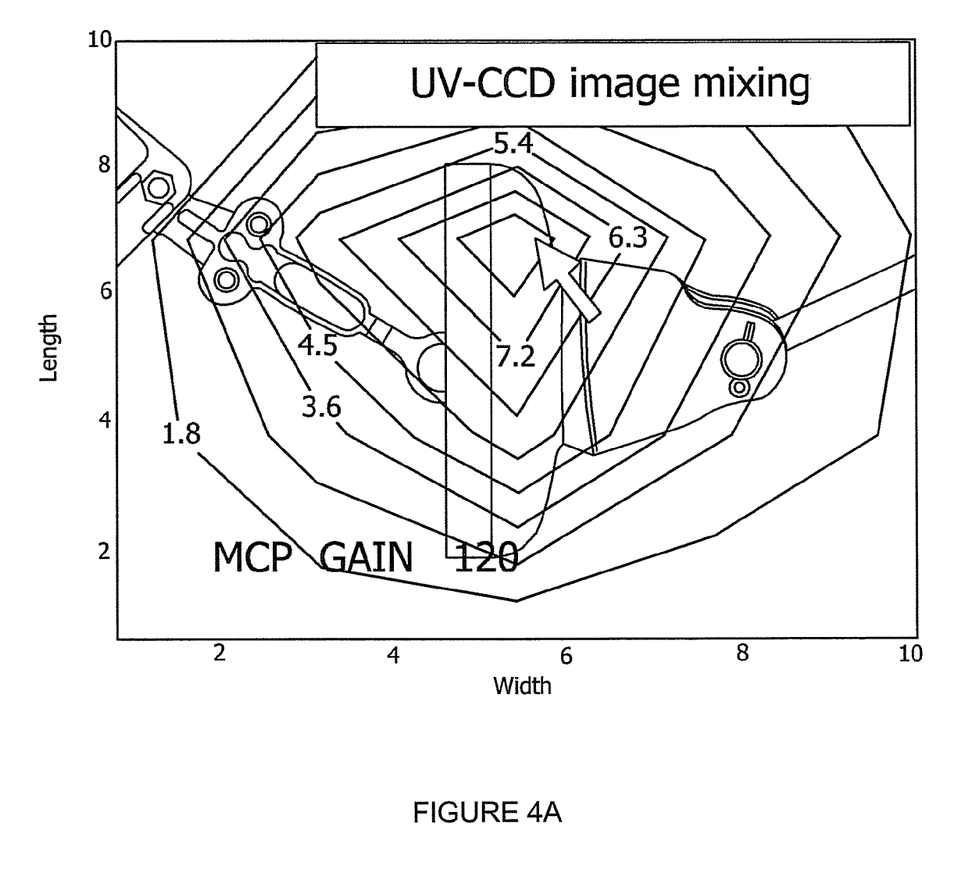
FIG. 4a is a combined image of UV discharge current data.
Figure 4B:
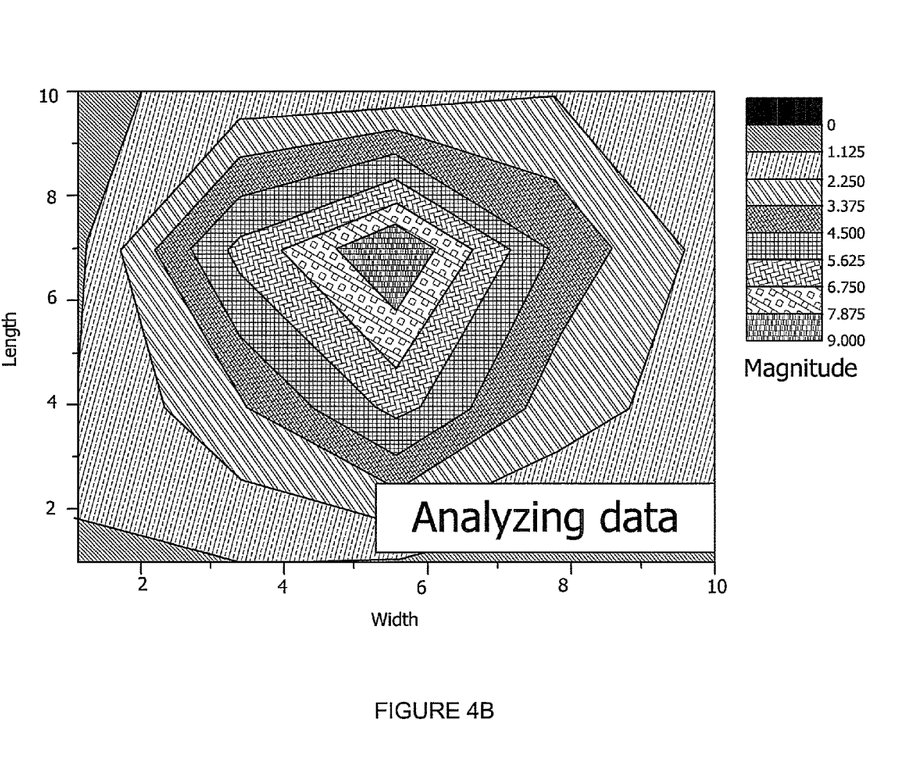
FIG. 4b is a graph depicting analysis data of the UV discharge current data.

FIG. 4a is a combined image of UV discharge current data, and FIG. 4b is a graph depicting analysis data of the UV discharge current data.

In other words, as shown in FIG. 4, a UV emitting location on the target can be verified by matching data of UV discharge current intensity measured by the UV intensity detection unit 30 to combined data of the actual image of the target supplied from the image measurement unit 20 and the sensor locations of the sensor array 10.

The apparatus may further include an analysis data output unit 50 that outputs analysis data obtained by combining data of the discharge current intensity measured by the UV intensity detection unit with data of the UV emitting location measured by the UV location detection unit.

FIG. 4b shows an example of analysis data, which is obtained by analyzing the intensity and emitting location of discharge current obtained upon detection of UV rays.

Next, a method of measuring, analyzing, and outputting partial discharge using a UV sensor array will be described in detail with reference to FIG. 5.

Figure 5:
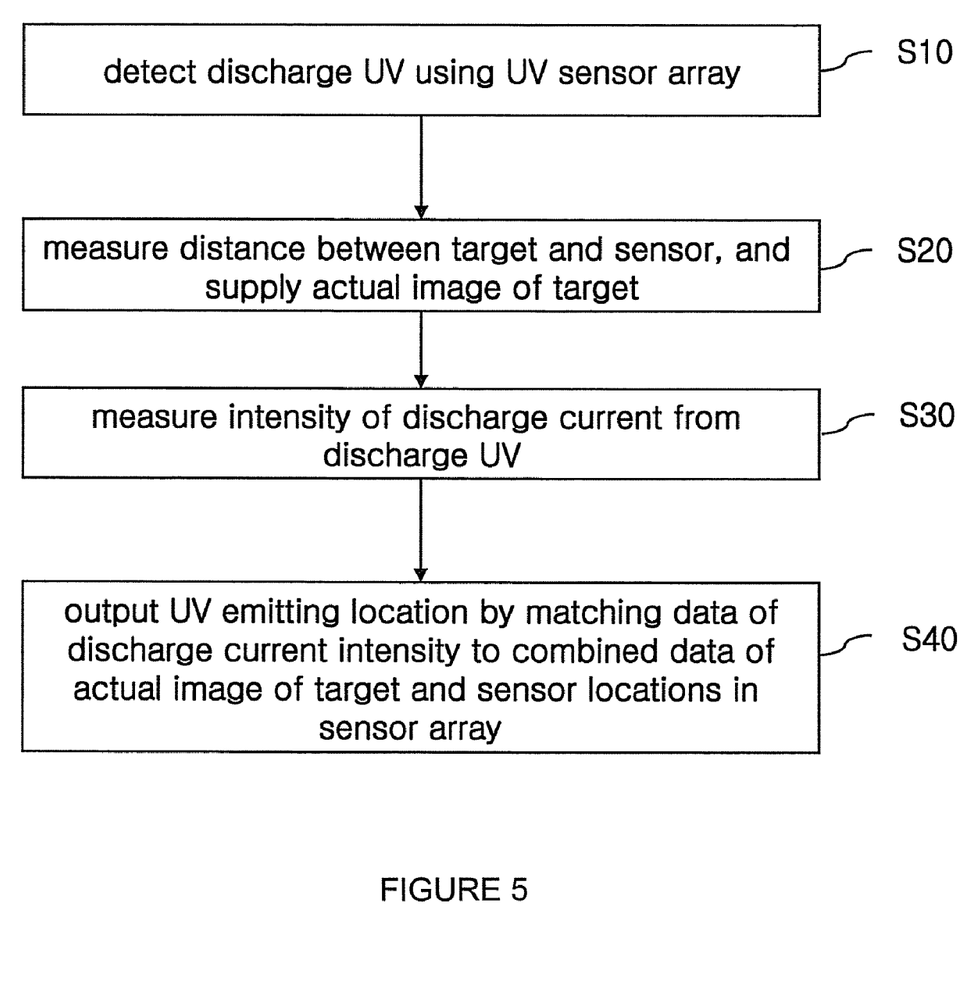
FIG. 5 is a flowchart of a method of measuring partial discharge using a UV sensor array according to an embodiment of the present invention.

FIG. 5 is a flowchart of a method of measuring partial discharge using a UV sensor array according to an embodiment of the present invention.

First, UV-rays emitted from an analyzing target of a power facility are detected by a sensor array, which is separated a predetermined distance from the target and includes a plurality of sensors, in S10.

In this embodiment, the UV sensor array 10 is a detection kit which includes plural sensors combined in a predetermined arrangement on a plane. In the UV sensor array 10, each of the sensors has a circumferential detection region, as shown in FIG. 2b, and can detect discharge UV rays in the corresponding detection region.

Next, the distance between the UV sensor array 10 and the target is measured and an actual image of the target is supplied by an image measurement unit 20 in S20.

The actual image of the target, and the distance between the NV sensor array 10 and the target are provided as UV detection results of the sensors to obtain an image for detecting a UV emitting location on the target.

Then, intensity of discharge current obtained by converting the UV rays detected by the sensor array is measured by a UV intensity detection unit 30 in S30.

Here, the NV rays detected by the UV sensors are converted into discharge current, which in turn is amplified to measure an amount of discharge current proportional to intensity of the emitted UV rays and is stored as discharge current data.

As a result, a UV emitting location on the target is output by matching data of the UV discharge current measured by the UV intensity detection unit 30 to combined data of the actual image of the target supplied from the image measurement unit 20 and sensor locations of the sensor array 10 in S40.

Here, the UV location detection unit 40 analyzes locations of the sensors of the sensor array 10 which detect the discharge current, and outputs the UV emitting location on the target of the power facility based on the combined data of the actual image of the target and the sensor locations in the sensor array 10, as shown in FIG. 2*d*.

Further, since the UV intensity detection unit 30 quantifies the intensity of UV rays caused by partial discharge into the discharge current intensity and stores the discharge current intensity data, it is possible to measure the intensity of UV rays with relation to the partial discharge based on the data.

As shown in FIGS. 4*a* and 4*b*, actual intensity and emitting locations of UV rays caused by partial discharge are analyzed and output as data of partial discharge current.

As apparent from the above description, according to the present invention, the apparatus for measuring partial discharge using a UV sensor array can employ discharge current to detect intensity and emitting locations of UV rays, which are caused by insulation deterioration of power facilities or discharge in air, and can provide analysis data of discharge quantity.

Further, the apparatus according to the present invention enables easy substitution of components through modification of the sensor array, and can be applied to a portable or on-line monitoring system, which can be used by an expert or an amateur in practice.

In understanding the scope of the present invention, the terms as used herein are given in consideration of functions of the elements of the present invention and can be changed according to intentions or customs of software developers and algorithm analysis in practice. Therefore, the definition of the terms should be made according to the overall disclosures set forth herein.

Although only selected embodiments have been chosen to illustrate the present invention, it will be apparent to those skilled in the art that the embodiments are given by way of illustration only, and that various modifications and changes can be made without departing from the spirit and scope of the present invention as defined by the accompanying claims and their equivalents.

What is claimed is:

1. An apparatus for measuring partial discharge using a UV sensor array, comprising:
    a UV sensor array comprising a plurality of sensors detecting UV rays from an analyzing target of a power facility at a location separated a predetermined distance from the target and converting the UV rays into discharge current, each of the sensors having a predetermined detection region;
    an image measurement unit measuring the distance between the sensor array and the target and supplying an actual image of the target;
    a UV intensity detection unit measuring intensity of the discharge current converted from the UV rays detected by the sensor array, quantifying the intensity of the UV rays with respect to each of the sensors and storing discharge current intensity data; and
    a UV location detection unit combining the actual image of the target supplied from the image measurement unit and the sensor locations of the sensor array, and matching the quantified discharge current intensity data of partial discharged current intensity with respect to each of sensors obtained from the UV intensity detection unit, and outputting the quantified discharge current intensity data with respect to each of the sensors.

2. The apparatus according to claim 1, wherein each of the sensors comprises:
    cathode and anode electrodes detecting and converting the UV rays into the discharge current;
    a guide mirror guiding the UV rays to the electrodes with respect to a predetermined detection region; and
    an amplifier amplifying the discharge current.

3. The apparatus according to claim 1, further comprising:
    an analysis data output unit outputting analysis data obtained by combining data of the discharge current intensity measured by the UV intensity detection unit and data of the UV emitting location output from the UV location detection unit.

4. A method of measuring partial discharge using a UV sensor array, comprising:
    detecting UV rays emitted from an analyzing target of a power facility with a sensor array at a location separated a predetermined distance from the target, the sensor array comprising a plurality of sensors, each of the sensors having a predetermined detection region;
    measuring the distance between the sensor array and the target and supplying an actual image of the target by an image measurement unit;
    measuring intensity of discharge current converted from the UV rays detected by the sensor array, quantifying the intensity of the UV rays with respect to each of the sensors and storing discharge current intensity data by a UV intensity detection unit; and combining the actual image of the target supplied from the image measurement unit and the sensor locations of the sensor array, and matching the quantified discharge current intensity data of partial discharged current intensity with respect to each of sensors obtained from the UV intensity detection unit, and outputting the quantified discharge current intensity data with respect to each of the sensors.

* * * * *